United States Patent
Anker (10) Patent No.: US 6,827,809 B2
(45) Date of Patent: Dec. 7, 2004

(54) METHOD OF TRANSFERRING A SUBSTANTIALLY DISC-SHAPED WORKPIECE, AND DEVICE FOR CARRYING OUT THIS METHOD

(75) Inventor: Joachim Anker, Hamburg (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/170,030

(22) Filed: Jun. 12, 2002

(65) Prior Publication Data

US 2003/0000635 A1 Jan. 2, 2003

(30) Foreign Application Priority Data

Jun. 15, 2001 (DE) .......................... 101 28 924

(51) Int. Cl.[7] .................. B32B 31/00; B32B 35/00; B32B 15/08; B65G 49/07
(52) U.S. Cl. .................. 156/249; 156/344; 438/458; 414/935
(58) Field of Search .................. 156/152, 230, 156/234, 241, 247, 249, 344, 584, 598, 540, 541; 438/455–458, 464, 477, 107; 414/935, 937, 939, 941; 117/915; 269/21

(56) References Cited

U.S. PATENT DOCUMENTS

| | | | | |
|---|---|---|---|---|
| 4,462,873 A | * | 7/1984 | Watanabe | ............ 156/150 |
| 4,591,044 A | * | 5/1986 | Ogami et al. | ............ 198/346.3 |
| 5,324,687 A | * | 6/1994 | Wojnarowski | ............ 438/107 |
| 5,447,596 A | * | 9/1995 | Hayase | ............ 156/584 |
| 5,958,794 A | * | 9/1999 | Bruxvoort et al. | ............ 438/692 |
| 6,173,750 B1 | * | 1/2001 | Davis et al. | ............ 156/584 |
| 6,391,679 B1 | * | 5/2002 | Anker et al. | ............ 438/106 |

FOREIGN PATENT DOCUMENTS

EP 999583 A2 * 5/2000 ......... H01L/21/302

* cited by examiner

Primary Examiner—Melvin C. Mayes
Assistant Examiner—Sing Po Chan
(74) Attorney, Agent, or Firm—Peter Zawilski (57) ABSTRACT

A technique for transferring a workpiece with one surface connected to a first workpiece carrier by a first adhesive onto a second workpiece carrier. This technique includes: fastening the second carrier to another surface of the workpiece with a second adhesive that has an adhesive force greater than the first adhesive, fastening the first earner to a first retaining device, fastening the second carrier to a second retaining device, separating the workpiece from the first carrier by a pulling force between the first and second retaining devices, separating the first carrier from the first retaining device, and separating the second carrier with the workpiece connected thereto from the second retaining device.

12 Claims, 13 Drawing Sheets

METHOD OF TRANSFERRING A SUBSTANTIALLY DISC-SHAPED WORKPIECE, AND DEVICE FOR CARRYING OUT THIS METHOD

The invention relates to a method of transferring a substantially disc-shaped workpiece. The invention further relates to a device for carrying out this method.

A temporary gluing on so-termed workpiece carriers, in particular carrier discs or carrier plates, is a suitable procedure in the case of one-sided or two-sided surface treatments of substantially planar, in particular very thin and brittle workpieces while this treatment is being carried out so as to avoid a deformation of the workpieces or indeed fracture thereof. A very thin workpiece in the present context should be understood to be a workpiece whose thickness is small in relation to its length, width, or diameter.

The German patent document 198 50 873 laid open to public inspection discloses a method of processing a substantially disc-shaped semiconductor technology product which comprises a plurality of electronic circuit bodies along at least a first main surface as well as a second main surface situated opposite the first main surface. In this method of carrying out treatment processes on one of the main surfaces of the product, a layer-type adhesive material is planarly provided on the opposite main surface of the product, onto which material a dimensionally at least substantially stable carrier element is provided so as to form a planar connection to said opposite main surface of the product.

The invention has for its object to provide a method by which a simple and inexpensive transfer of a workpiece of the kind mentioned above from a first workpiece carrier onto a second workpiece carrier is rendered possible. The invention further has for its object to provide a device for carrying out such a method.

According to the invention, this object is achieved by means of a method of transferring a substantially disc-shaped workpiece from a first workpiece carrier, on which the workpiece is adhesively connected along a first of its main surfaces by means of a first adhesive in an at least substantially planar manner, onto a second workpiece carrier, which method according to the invention comprises the following process steps:

fastening the second workpiece carrier with at least substantially planar adhesion to a second of the main surfaces of the workpiece opposed to the first main surface by means of a second adhesive whose adhesive force is substantially greater than the adhesive force of the first adhesive, fastening the first workpiece carrier to a first retaining device, fastening the second workpiece carrier to a second retaining device, separating the workpiece from the first workpiece carrier along the first adhesive through the application of a pulling force between the first and the second retaining device, which force is at least partly perpendicular to the main surfaces of the workpiece, separating the first workpiece carrier from the first retaining device, and separating the second workpiece carrier complete with the workpiece connected thereto from the second retaining device.

The workpiece is accordingly present on the first workpiece carrier, to which it was fastened by its first main surface by means of the first adhesive, at the start of the process steps according to the invention. The workpiece is transferred from this first workpiece carrier onto a second workpiece carrier by means of the method according to the invention, on which second carrier it is arranged with at least substantially planar adhesion along its second main surface. The connection between the second main surface of the workpiece and the second workpiece carrier is achieved here by the second adhesive whose adhesive force is substantially greater than the adhesive force of the first adhesive, so that the first adhesive is reliably separated when the pulling force is applied between the retaining devices, whereas the second adhesive keeps the workpiece fixed to the second workpiece carrier. The retaining devices here serve to transmit the pulling force to the workpiece carriers and are separated from the workpiece carriers again after the transfer of the workpiece has been completed.

The method according to the invention renders it possible in an inexpensive and simple manner to transfer mechanically vulnerable workpieces safely from one workpiece carrier to another. A separate treatment of the first adhesive for changing the adhesive force before the transfer of the workpiece is not necessary.

In particular, at least substantially rigidly constructed workpiece carriers can be used here.

The fastening of the workpiece carriers to the retaining devices may be achieved by means of adhesives or by magnetic forces, as desired. Said adhesives or magnetic forces will generate adhesive forces between the workpiece carriers and the retaining devices which are substantially greater than the adhesive force of the first adhesive, so that the workpiece carriers remain securely connected to the retaining devices when the pulling force is exerted.

The separation of the workpiece carriers from the retaining devices after the transfer of the workpiece is preferably achieved by means of an ejection device forming part of at least one of the retaining devices. This ejection device advantageously operates at least one ejector pin or a pressure gas device when carrying out the separation step so as to exert a pressure on the workpiece to be separated.

In an alternative advantageous embodiment of the method according to the invention, the workpiece carrier is arranged on a support element in at least one of the retaining devices in which the fastening of the workpiece carrier is achieved by means of said magnet device, which support element is movable with respect to a magnet device and is of a substantially planar construction. The support element is moved together with the workpiece carrier from the operational reach of the magnet device for separating the workpiece carrier from the retaining device. This removal may preferably be achieved in that at least one of the workpiece carriers is arranged on a first support element, preferably of planar steel sheet on rollers, and the workpiece carrier is transferred to a second planar sheet support element through rolling of the first planar sheet support element for the purpose of separation from the retaining device.

Further embodiments and details of the method according to the invention are defined in the dependent claims following claim 1.

To carry out the method according to the invention, furthermore, a device is provided for transferring a substantially disc-shaped workpiece from a first workpiece carrier, on which the workpiece is adhesively connected in an at least substantially planar manner along a first of its main surfaces by means of a first adhesive, onto a second workpiece carrier on which the workpiece is to be provided and fastened with at least substantially planar adhesion by a second of its main surfaces opposed to the first main surface of the workpiece by means of a second adhesive whose adhesive force is substantially greater than the adhesive force of the first adhesive. In addition to the workpiece carriers for fastening the workpiece, the device according to the invention also comprises a first retaining device for fastening the first workpiece carrier to this first retaining device and a second retaining device for fastening the second workpiece carrier to this second retaining device.

A device according to the invention is preferably used for handling a workpiece which is a semiconductor technology product, preferably a semiconductor wafer, and which furthermore is constructed along at least its second main surface for forming a plurality of electronic circuit bodies which are to be mechanically separated substantially perpendicularly to the second main surface. The invention in that case renders it possible to present the workpiece on the second workpiece carrier for a subsequent treatment of its first main surface in a simple manner by means of the transfer that can be carried out thereby, for example for a process step for thinning, coating, or the like.

Further embodiments and details of the device according to the invention can be found in the dependent claims following the independent claim 13.

The device according to the invention is of a simple construction and renders possible a reliable, inexpensive, and thus rational manufacture.

An embodiment of the invention is shown in the drawing and will be described in more detail below. In the drawing.

Figure 1:
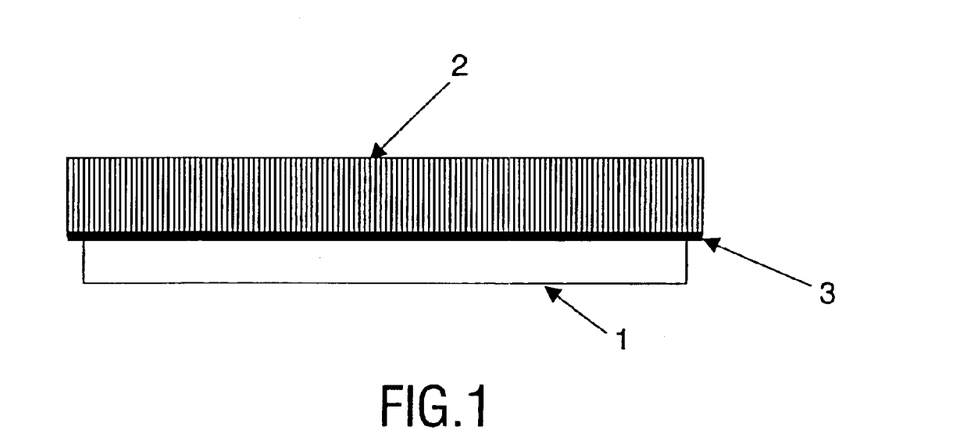
FIG. 1 diagrammatically shows an example of a workpiece fastened on a first workpiece carrier by means of a first adhesive, FIG. 2 diagrammatically shows the workpiece carrier with the workpiece of FIG. 1 after fastening of a second workpiece carrier on the workpiece opposite the first workpiece carrier, FIG. 3 diagrammatically shows the workpiece with the two workpiece carriers of FIG. 2 after fastening of the first workpiece carrier to a first retaining device and of the second workpiece carrier to a second retaining device in a first embodiment of the invention.
Figure 4:
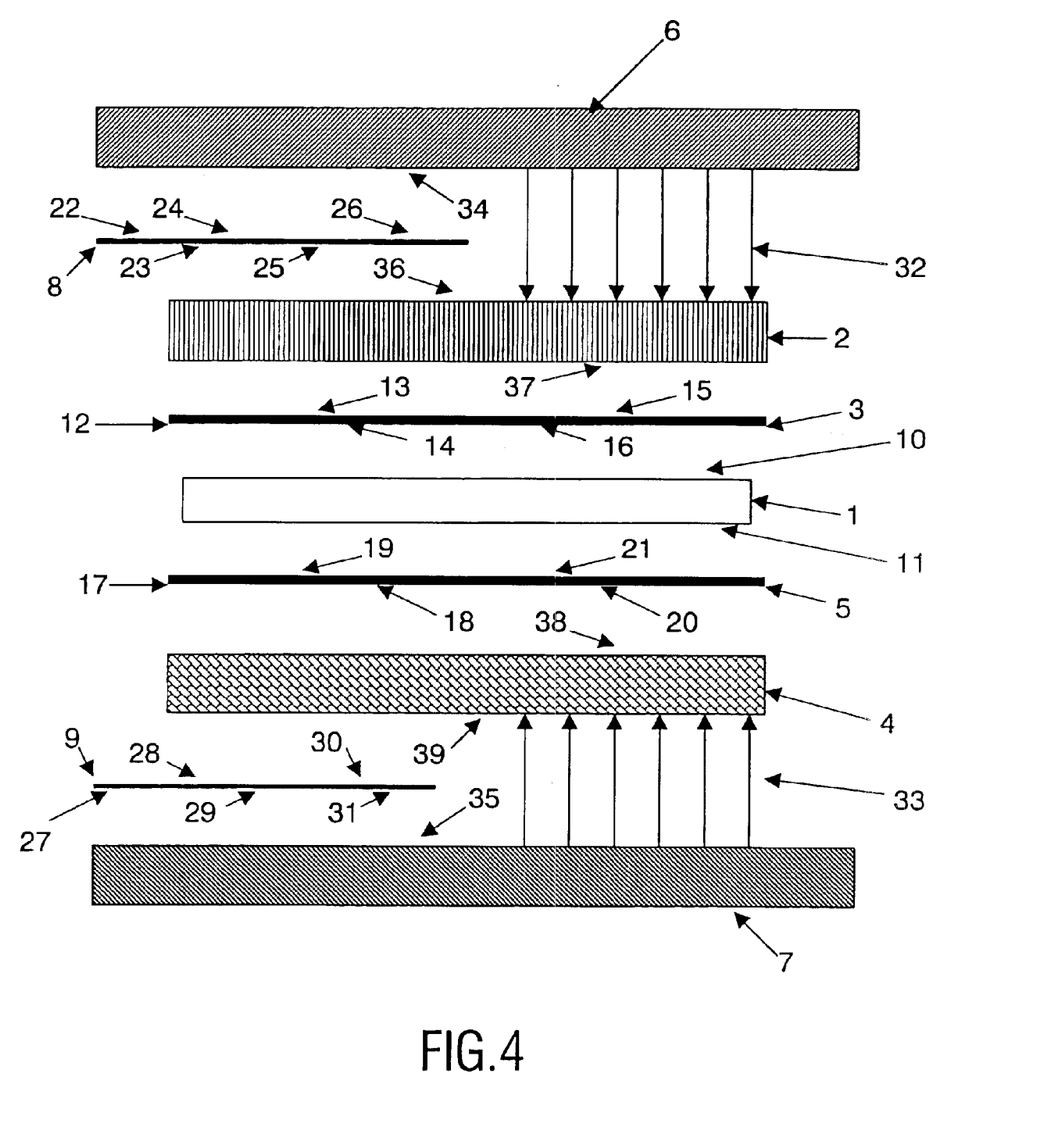
FIG. 4 is a diagrammatic exploded view of the arrangement of FIG. 3.

In the diagrammatic picture of FIG. 1, a substantially disc-shaped workpiece 1, in particular a thin semiconductor wafer, is fastened by its first main surface, which forms the upper surface in the position of the workpiece 1 shown, to a first, at least substantially rigidly constructed workpiece carrier 2 by means of a first adhesive 3 in a planar manner. The first adhesive 3 is preferably formed by a first adhesive constructed as a first, double-sided adhesive foil 3. This first double-sided adhesive foil 3 consists in a known manner of a foil-shaped synthetic resin body whose two surfaces are coated with adhesive layers. A first of these surfaces faces the first workpiece carrier 2 with a first adhesive layer and a second of these surfaces faces the workpiece 1 with a second adhesive layer. This arrangement is shown in FIG. 4.

Figure 2:
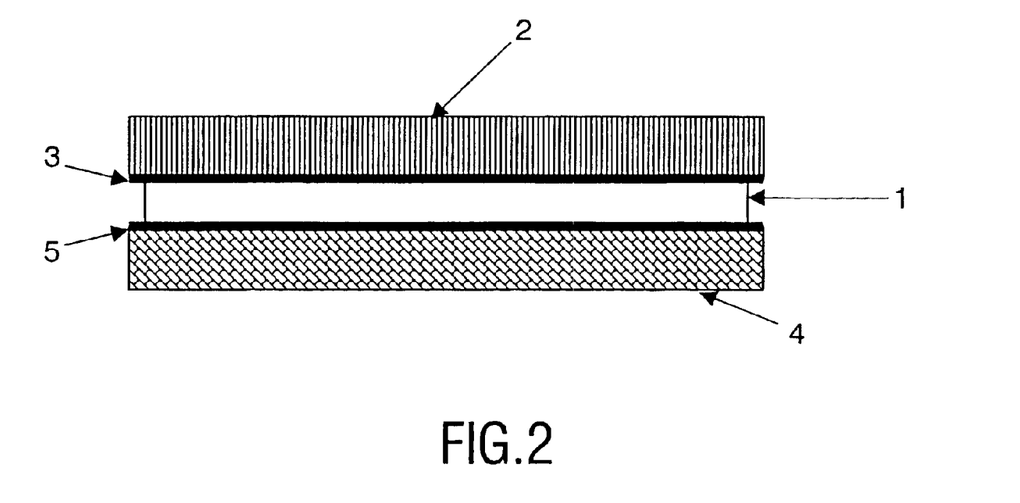

The picture of FIG. 2 diagrammatically shows the next process step. Here the workpiece 1 and the first workpiece carrier 2 are fastened onto a second, at least substantially rigidly constructed workpiece carrier 4 in an at least substantially planar adhesive manner by a second main surface of the workpiece 1, opposed to the first main surface and forming the lower side in the position of the workpiece 1 shown here, by means of a second adhesive 5. The adhesive force of the second adhesive 5 is substantially greater than the adhesive force of the first adhesive 3. The second adhesive 5 is preferably also formed by an adhesive layer constructed with a double-sided adhesive foil; this adhesive denoted the second adhesive below is formed by a second double-sided adhesive foil. The second double-sided adhesive foil 5 again consists in a known manner of a foil-shaped synthetic resin body whose two surfaces are covered with adhesive layers. A first of these surfaces faces the second workpiece carrier 2 with a third adhesive layer, and a second of these surfaces faces the workpiece 1 with a fourth adhesive layer. This arrangement is also shown in FIG. 4.

Figure 3:
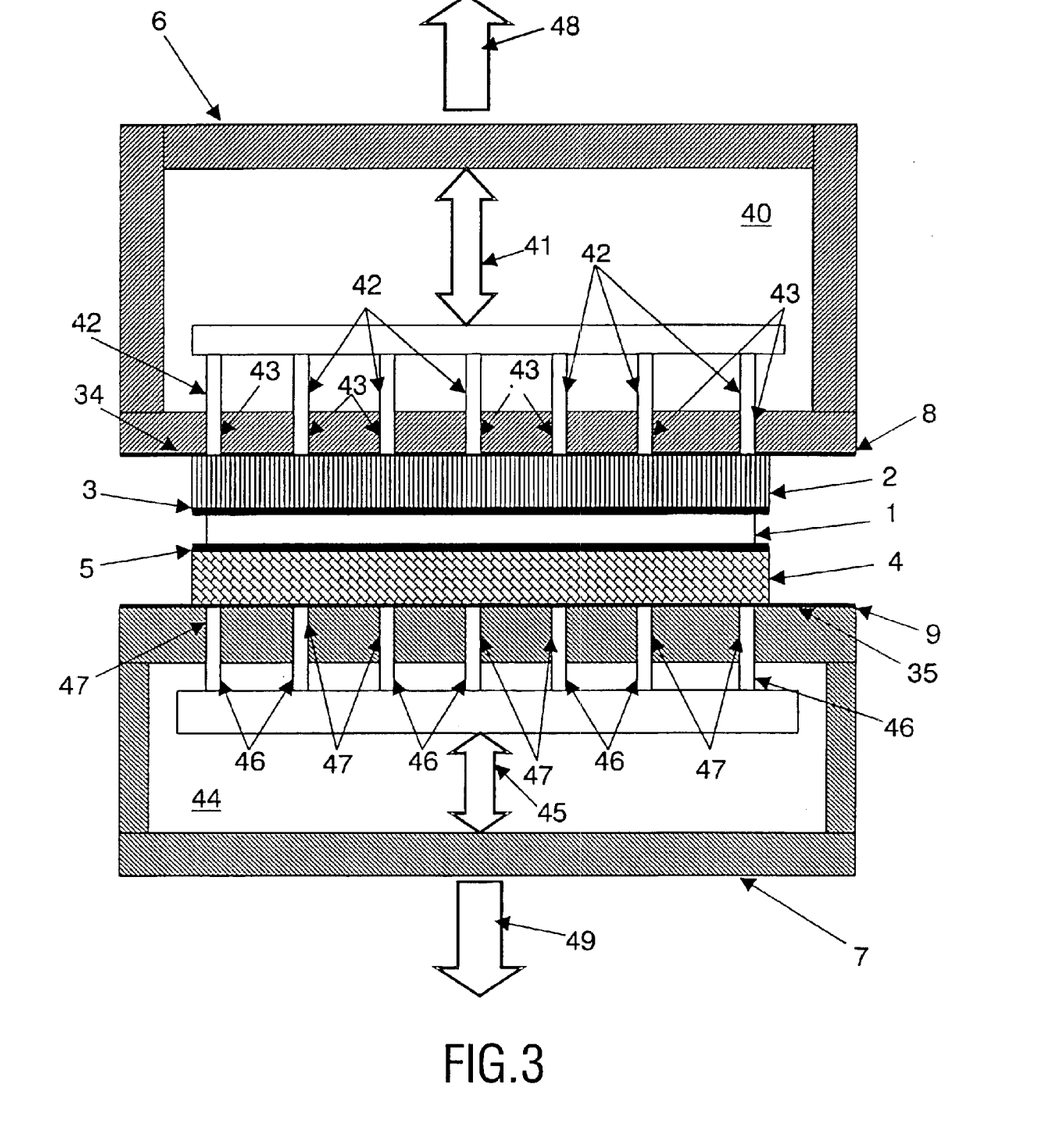

FIG. 3 shows a first embodiment of how the arrangement, diagrammatically shown in FIG. 2, of the workpiece 1, the workpiece carriers 2, 4, and the adhesives 3, 5 interconnecting the former is placed between two retaining devices. The first workpiece carrier 2 is fastened to a first of these retaining devices referenced 6, and the second workpiece carrier 4 is fastened to a second of these retaining devices referenced 7. The fastening of the first workpiece carrier 2 to the first retaining device 6 in this first embodiment is achieved by means of a third adhesive 8, and the fastening between the second workpiece carrier 4 to the second retaining device 7 is achieved by means of a fourth adhesive 9. The adhesive forces of the third adhesive 8 between the first workpiece carrier 2 and the first retaining device 6 and of the fourth adhesive 9 between the second workpiece carrier 4 and the second retaining device 7 are substantially greater than the adhesive force of the first adhesive 3 and also greater than the adhesive force of the second adhesive 5. It is ensured thereby that the first adhesive 3 will be the first to be separated in the separation step.

The third and the fourth adhesive 8, 9 may again be preferably formed by double-sided adhesive foils, i.e. a third and a fourth double-sided adhesive foil. Each of these double-sided adhesive foils 8 and 9 is again formed by a foil-shaped synthetic resin body whose two surfaces are coated with adhesive layers. A first of these surfaces of the third double-sided adhesive foil 8 faces the first workpiece carrier 2 with a fifth adhesive layer, and a second of these surfaces of the third double-sided adhesive foil 8 faces the first retaining device 6 with a sixth adhesive layer. Similarly, a first of said surfaces of the fourth double-sided adhesive foil 9 faces the second workpiece carrier 4 with a seventh adhesive layer, and a second of these surfaces of the fourth double-sided adhesive foil 9 faces the second retaining device 7 with an eighth adhesive layer. This arrangement is shown in FIG. 4.

FIG. 4 diagrammatically shows the surfaces and adhesive layers mentioned above in their mutual arrangement in more detail. Besides the elements already given reference numerals in the description above, whose reference numerals are maintained unchanged, the following further elements with the following reference numerals are also depicted: the first main surface 10 and the second main surface 11 of the workpiece 1; the synthetic resin body 12, the first surface 13 with the first adhesive layer 15 and the second surface 14 with the second adhesive layer 16 of the first double-sided adhesive foil 3; the synthetic resin body 17, the first surface 18 with the third adhesive layer 20 and the second surface 19 with the fourth adhesive layer 21 of the second double-sided adhesive foil 5; the synthetic resin body 22, the first surface 23 with the fifth adhesive layer 25 and the second surface 24 with the sixth adhesive layer 26 of the third double-sided adhesive foil 8; and the synthetic resin body 27, the first surface 28 with the seventh adhesive layer 30 and the second surface 29 with the eighth adhesive layer 31 of the fourth double-sided adhesive foil 9.

In an embodiment of the first adhesive as a first double-sided adhesive foil 3, the second adhesive layer 16 preferably has the weakest adhesive force with respect to the workpiece 1, with the result that this first double-sided adhesive foil 3 will remain on the first workpiece carrier 2 during separation of the workpiece 1 from the first workpiece carrier 2, thus releasing the workpiece 1.

Diagrammatically showing an embodiment of at least one of the retaining devices 6, 7 in a construction with a magnet device, FIG. 4 further shows a magnetic field 32 between the first retaining device 6 and the first workpiece carrier 2 replacing the third adhesive 8, and a magnetic field 33 between the second retaining device 7 and the second workpiece carrier 4 replacing the fourth adhesive 9. The workpiece carriers 2, 4 are constructed from a ferromagnetic material for this purpose. The retaining devices 6, 7 comprise a first and second magnet device, respectively, which can be energized and de-energized, as required, for fastening the associated workpiece carriers 2, 4 to the retaining devices by means of magnetic attraction. The magnetic forces occurring in that case between the retaining device 6 or 7 and the associated workpiece carrier 2 or 4 are chosen to be substantially greater than the adhesive force of the first adhesive 3. An embodiment of a retaining device of this construction is shown in a few Figures which will be described further below.

FIG. 4 further shows the following elements for general orientation: a surface 34 of the first retaining device 6 along which the first retaining device 6 is connected to the first workpiece carrier 2 in an at least substantially planar manner; a surface 35 of the second retaining device 7 along which the second retaining device 7 is connected to the second workpiece carrier 4 in an at least substantially planar manner; a surface 36 of the first workpiece carrier 2 along which the first workpiece carrier is connected to the surface 34 of the first retaining device 6 in an at least substantially planar manner; a surface 37 of the first workpiece carrier 2 along which the first workpiece carrier 2 is connected to the first main surface 10 of the workpiece 1 in an at least substantially planar manner; a surface 38 of the second workpiece carrier 4 along which the second workpiece carrier 4 is connected to the second main surface 11 of the workpiece 1 in an at least substantially planar manner; and a surface 39 of the second workpiece carrier 4 along which the second workpiece carrier 4 is connected to the surface 35 of the second retaining device 7 in an at least substantially planar manner.

In the first embodiment of FIG. 3, in which the first workpiece carrier 2 is fastened to the first retaining device 6 by means of the third adhesive 8 and to the second workpiece carrier 4 by means of the fourth adhesive 9, the first retaining device 6 comprises a first ejection device 40. The latter is provided with a plunger 41 and ejector pins 42. The ejector pins 42 are passed through voids (for example bores) 43 in the surface 34 facing the first workpiece carrier 2, so that they can come into mechanical contact with the first workpiece carrier 2. The first workpiece carrier 2 can be detached from the first retaining device 6 through a pressure exerted by the ejector pins 42 on the surface 34 of the first workpiece carrier 2 facing the first retaining device 6.

Similarly, the second retaining device 7 in the first embodiment of FIG. 3 comprises a second ejector device 44. This is provided with a plunger 45 and ejector pins 46. The ejector pins 46 are passed through voids (for example bores) 47 in the surface 35 facing the second workpiece carrier 4, so that they can come into mechanical contact with the second workpiece carrier 4. A pressure exerted by the ejector pins 46 on the surface 35 of the second workpiece carrier 4 facing the second retaining device 7 causes said carrier to be detached from the second retaining device 7.

FIG. 3 shows the first embodiment of the device according to the invention after the conclusion of the process step in which the retaining devices 6, 7 were connected to the workpiece carriers 2, 4. The assembly of the workpiece 1, the workpiece carriers 2, 4, and the retaining devices 6, 7 is now introduced into a pulling device capable of exerting a pulling force on the workpiece carriers 2, 4 via the retaining devices 6, 7, which force is at least partly—in the embodiment shown preferably at least substantially exactly—perpendicular to the main surfaces of the workpiece 1. The action of this pulling device, i.e. the direction of the pulling force, is diagrammatically indicated with the arrows 48 and 49 in FIG. 3.

Figure 5:
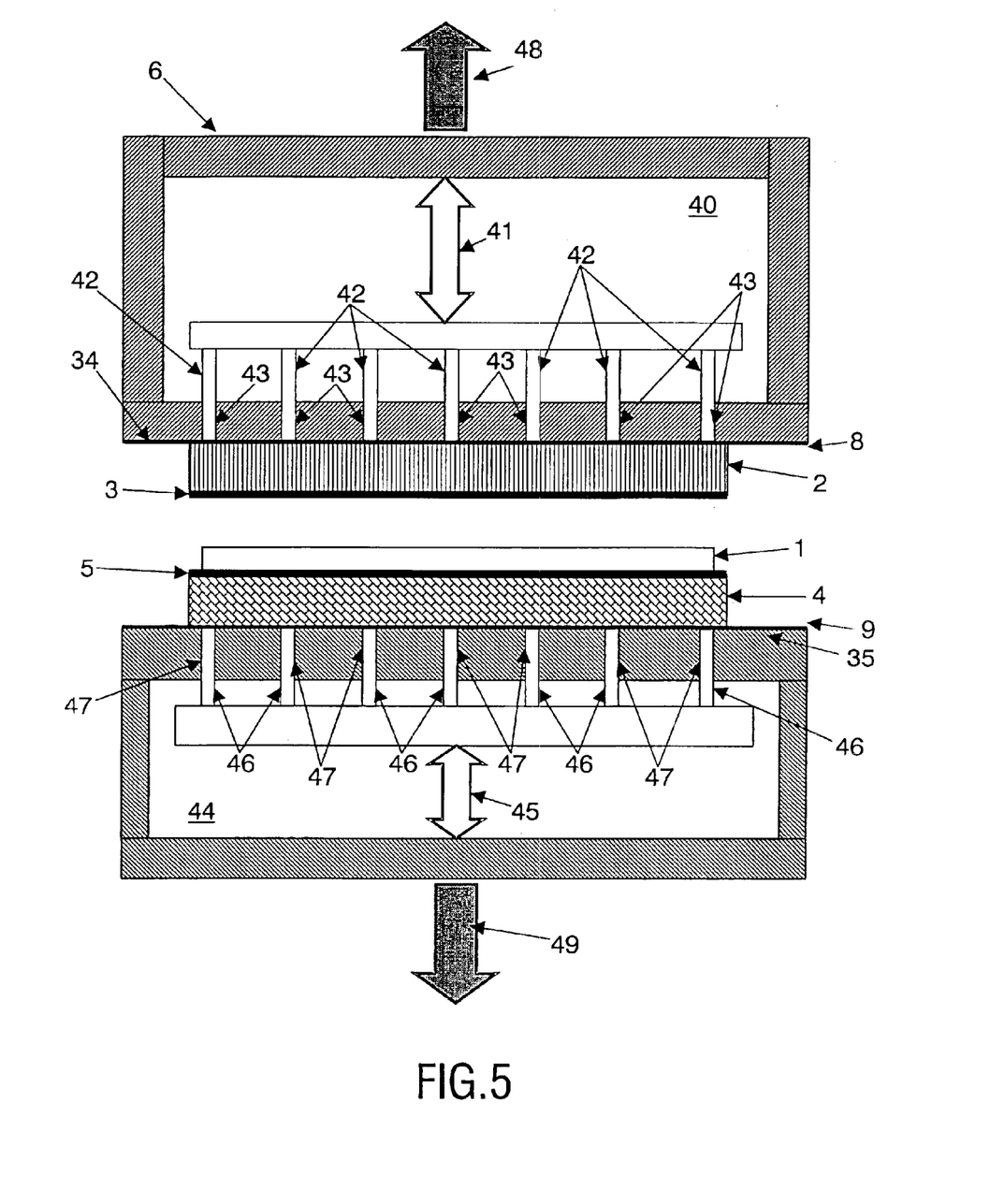
FIG. 5 shows the arrangement of FIG. 3 after separating of the workpiece from the first workpiece carrier.

FIG. 5 shows the arrangement of FIG. 3 after the next process step, wherein the elements described above have again been given the same reference numerals. The action of the pulling forces applied to the retaining devices 6 and 7, the effect of which is indicated by the dark hatching of the arrows 48 and 49, pulls the configuration of the retaining devices 6, 7, the workpiece carriers 2, 4, and the workpiece 1 apart. During this, the first adhesive 3 becomes detached, i.e. in particular, when constructed as a double-sided adhesive foil, the second adhesive layer 16 thereof forming the weakest link between said elements of the arrangement. The state of the arrangement after this separation step is shown in FIG. 5.

Figure 6:
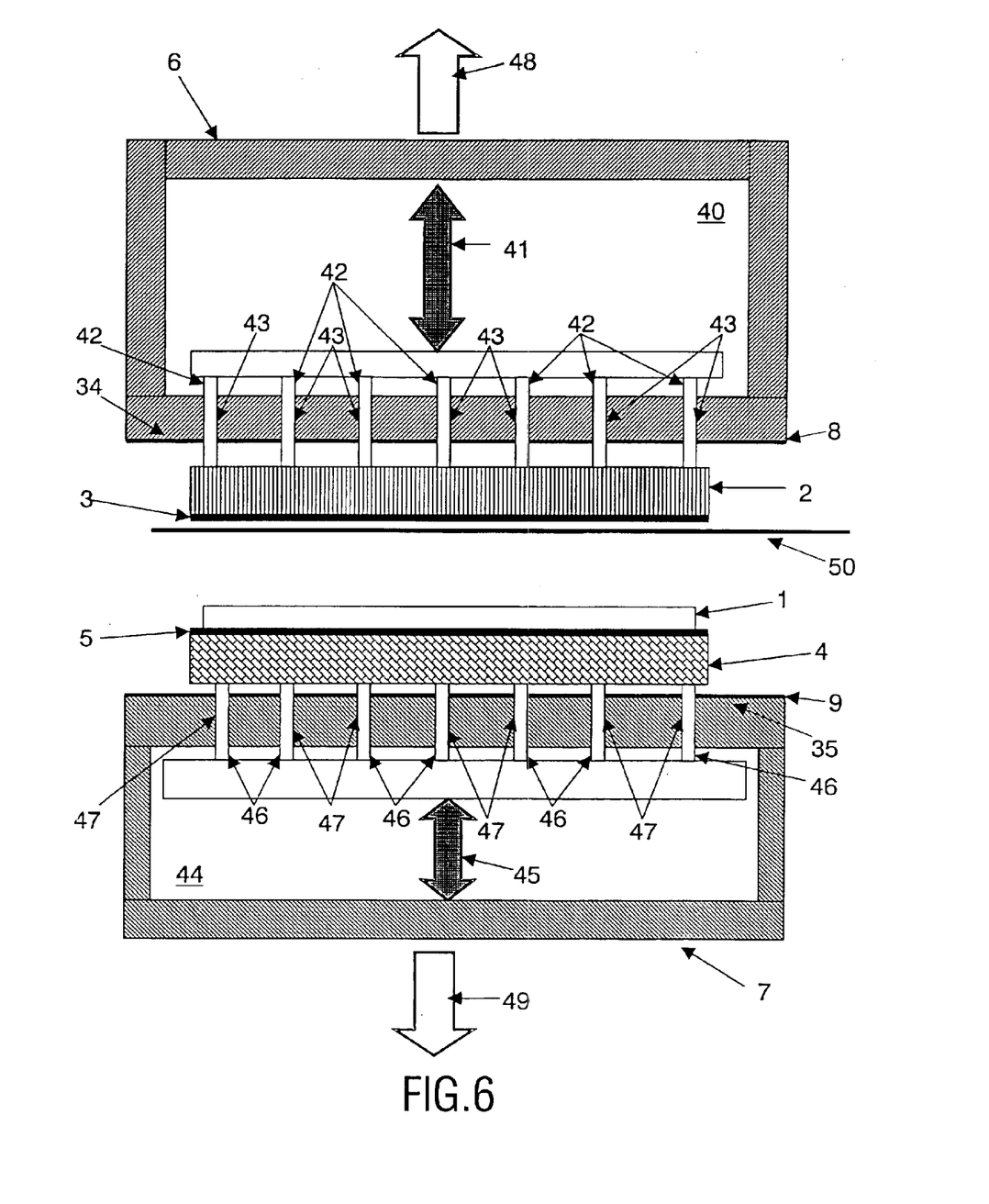
FIG. 6 shows the arrangement of FIGS. 3 and 5 after the additional separation of the first workpiece carrier from the first retaining device and of the second workpiece carrier with the workpiece joined thereto from the second retaining device, FIG. 7 diagrammatically shows a modification of the arrangement of FIG. 3 in a second embodiment.

FIG. 6 diagrammatically shows the implementation of the separation of the workpiece carriers 2, 4 from the retaining devices 6, 7 as the next process step for the embodiment of the arrangement of FIGS. 3 and 5. Identical elements have again been given the same reference numerals.

In the first process step clarified in FIG. 6, the first workpiece carrier 2 of this embodiment is separated from the first retaining device 6 through the operation of the plunger 41 of the first ejection device 40. This is symbolized by the dark hatching of the arrow 41. The plunger 41 moves the ejector pins 42 through the bores 43 against the first workpiece carrier 2, thus detaching the third adhesive 8. If the latter was constructed as a double-sided adhesive foil in the manner described, adhering to the surface 34, it is in particular the fifth adhesive layer 25 on the first surface 23 of this foil that will become detached in this separation step. The foil thus remains on the first retaining device 6 and may be used for a subsequent connection of the first retaining device 6 to a (further) first workpiece carrier 2 (for a further workpiece 1). To achieve a friction-free performance of this process step, the third double-sided adhesive foil 8 has holes in the locations of the bores 43 in accordance with the diameter thereof or with the diameter of the ejector pins 42.

A surface 34 of the first retaining device 6 thus formed with the third double-sided adhesive foil 8 is diagrammatically depicted in FIG. 10, which will be referred to in more detail further below.

The arrangement of FIG. 6 further comprises a support 50 for receiving the first workpiece carrier 2 after it has become detached from the first retaining device 6. The first workpiece carrier 2 is laid on this support 50 for future use.

In a manner similar to that of the first workpiece carrier 2 and the first retaining device 6, the second workpiece carrier 4 is also separated from the second retaining device 7. This is shown in the lower part of FIG. 6. For this purpose, the second ejection device 44 is used in the same manner with the ejector pins 46 passed through the bores 47 through operation of the plunger 45; the operation is symbolized by the dark hatching of the arrow for the plunger 45. The fourth adhesive 9 is detached thereby; if the fourth adhesive 9 is constructed as a double-sided adhesive foil, its seventh adhesive layer 30 present on the first surface 28 of the fourth double-sided adhesive foil 9 will preferably be separated, so that again the double-sided adhesive foil 9 remains on the surface 35 of the second retaining device 7. A support (not shown) corresponding to the support 50 may be used for taking up the second workpiece carrier 4 with the workpiece 1 separated from the second retaining device 7.

Figure 7:
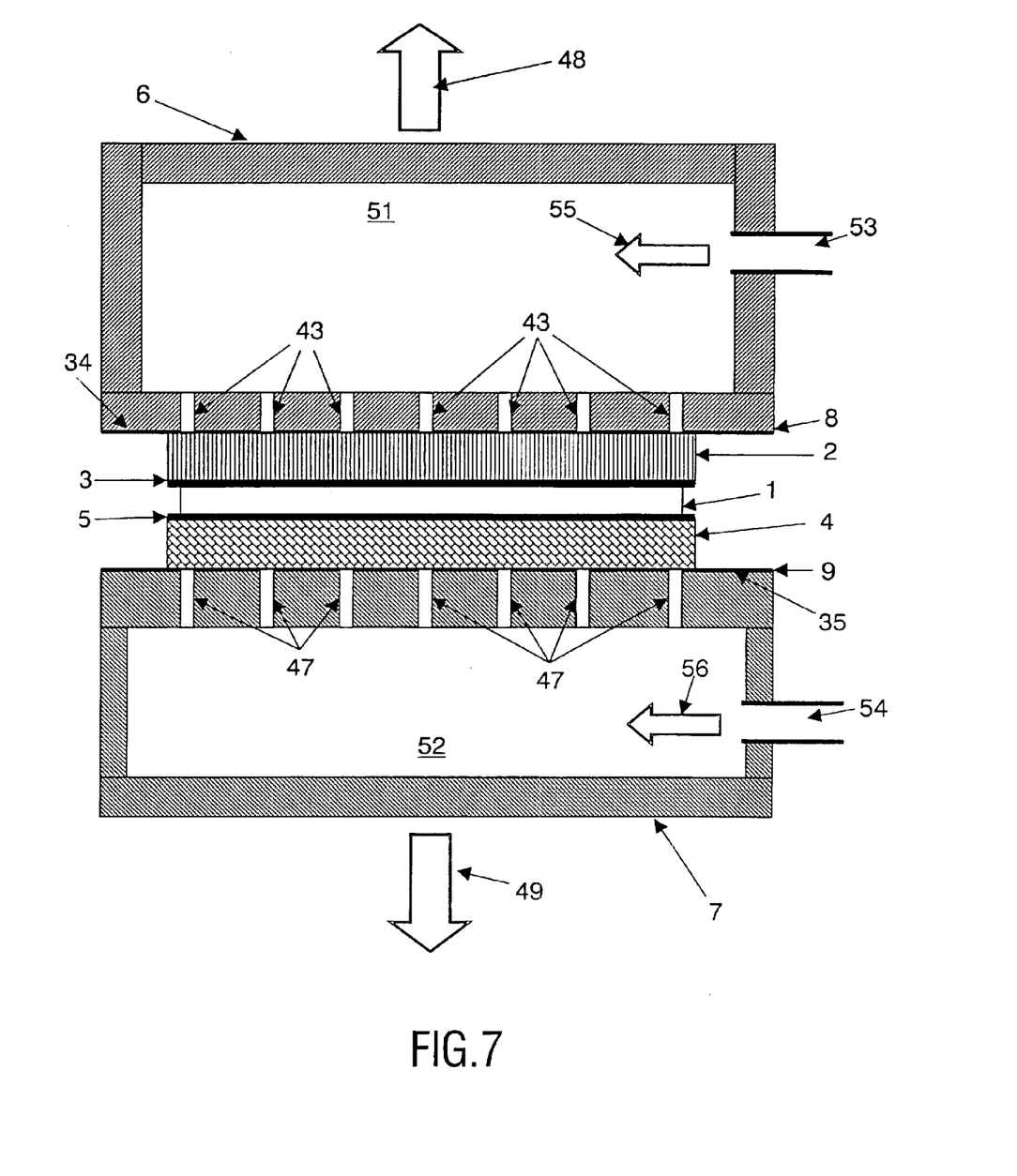

FIG. 7 shows a second embodiment of the invention, being a modification of the above arrangement and the method carried out thereby. The ejection devices of the retaining devices 6, 7 now each comprise, instead of the plungers 41, 45 and the ejector pins 42, 46, a pressure gas device 51, 52 by means of which the workpiece carriers 2, 4 are separated from said respective retaining devices 6, 7 through a pressure exerted on the surfaces 36, 39 of the first and second workpiece carriers 2, 4 facing the surfaces 34, 35 of the respective retaining devices 6, 7. Otherwise, elements of the arrangement of FIG. 7 already described have again been given the same reference numerals.

The first of the two pressure gas devices referenced 51 in the first retaining device 6 comprises a first pressure gas connection 53 through which a gas under pressure, in the simplest case constituted by compressed air, but alternatively of some other composition if this should be desirable for handling the workpieces (protective gas), is conducted into a hollow space denoted the pressure chamber, which is formed in the first retaining device 6. This pressure chamber connects the first pressure gas connection 53 to the bores 43 in the surface 34 of the first retaining device 6, which now serve as gas outlets. An arrow 55 indicates the introduction of gas under pressure and thus the force exerted on the first workpiece carrier 2.

In a similar manner, the second of the two pressure gas devices referenced 52 in the second retaining device 7 comprises a second pressure gas connection 54 through which the gas under pressure is conducted into a further pressure chamber which is formed in the second retaining device 7 in a corresponding manner. This further pressure chamber connects the second pressure gas connection 54 to the bores 47 in the surface 35 of the second retaining device 7 which now serve as gas outlets. An arrow 56 indicates the introduction of the gas under pressure and thus the force exerted on the second workpiece carrier 4.

Figure 8:
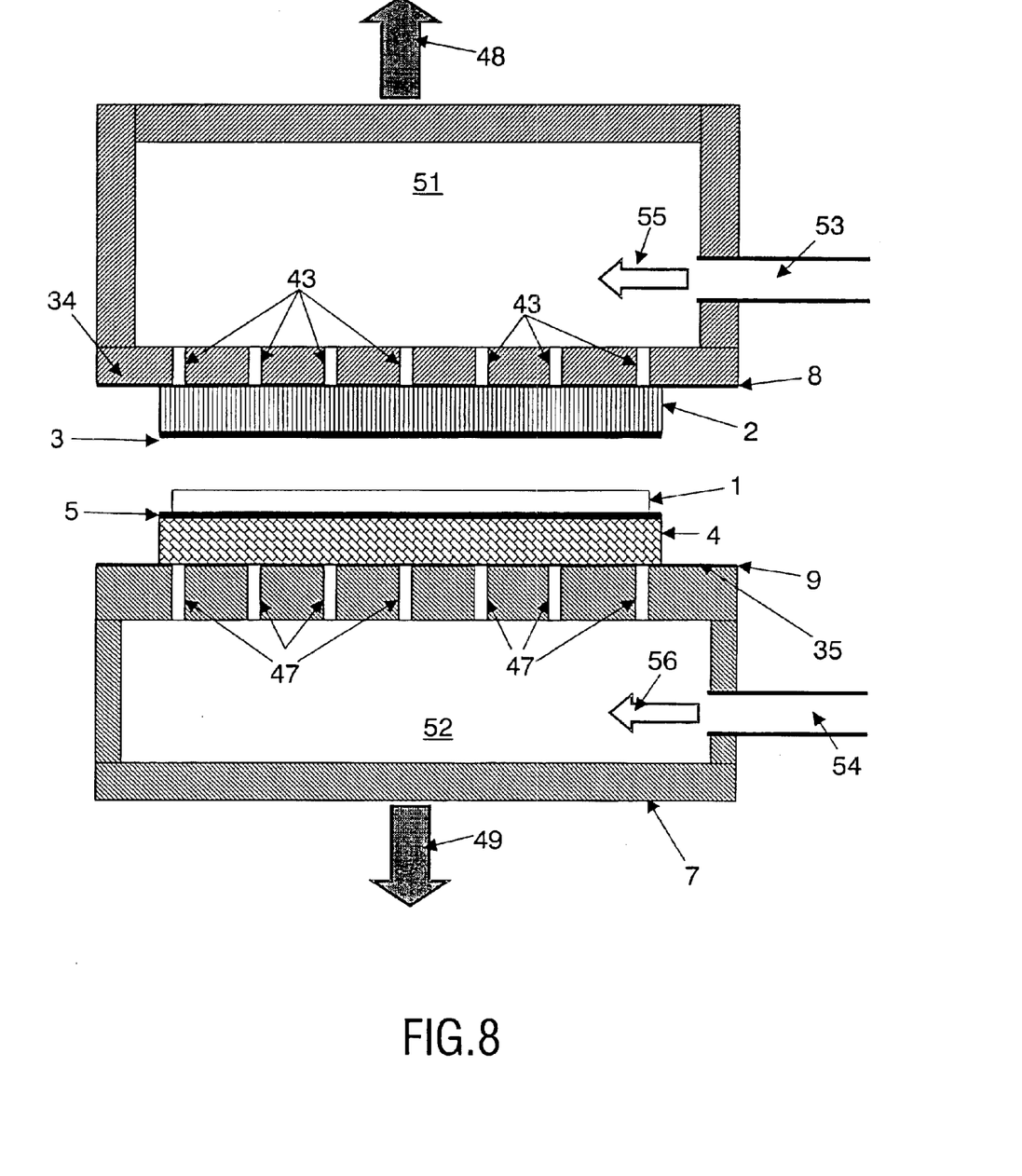
FIG. 8 shows the arrangement of FIG. 7 after the separation of the workpiece from the first workpiece carrier.

FIG. 8 shows the arrangement of FIG. 7 after the next process step, with the elements described above again having the same reference numerals. The pulling forces exerted on the retaining devices 6 and 7, whose effect is indicated with the dark hatching of the arrows 48 and 49, as in the first embodiment of FIG. 3, pull the configuration of the retaining devices 6, 7, the workpiece carriers 2, 4, and the workpiece 1 apart. The first adhesive 3 is detached again thereby, and if constructed as a double-sided adhesive foil, the second adhesive layer 16 is detached in particular as being the weakest link between the said elements of the arrangement. The state of the arrangement after this separation step is shown in FIG. 8.

Figure 9:
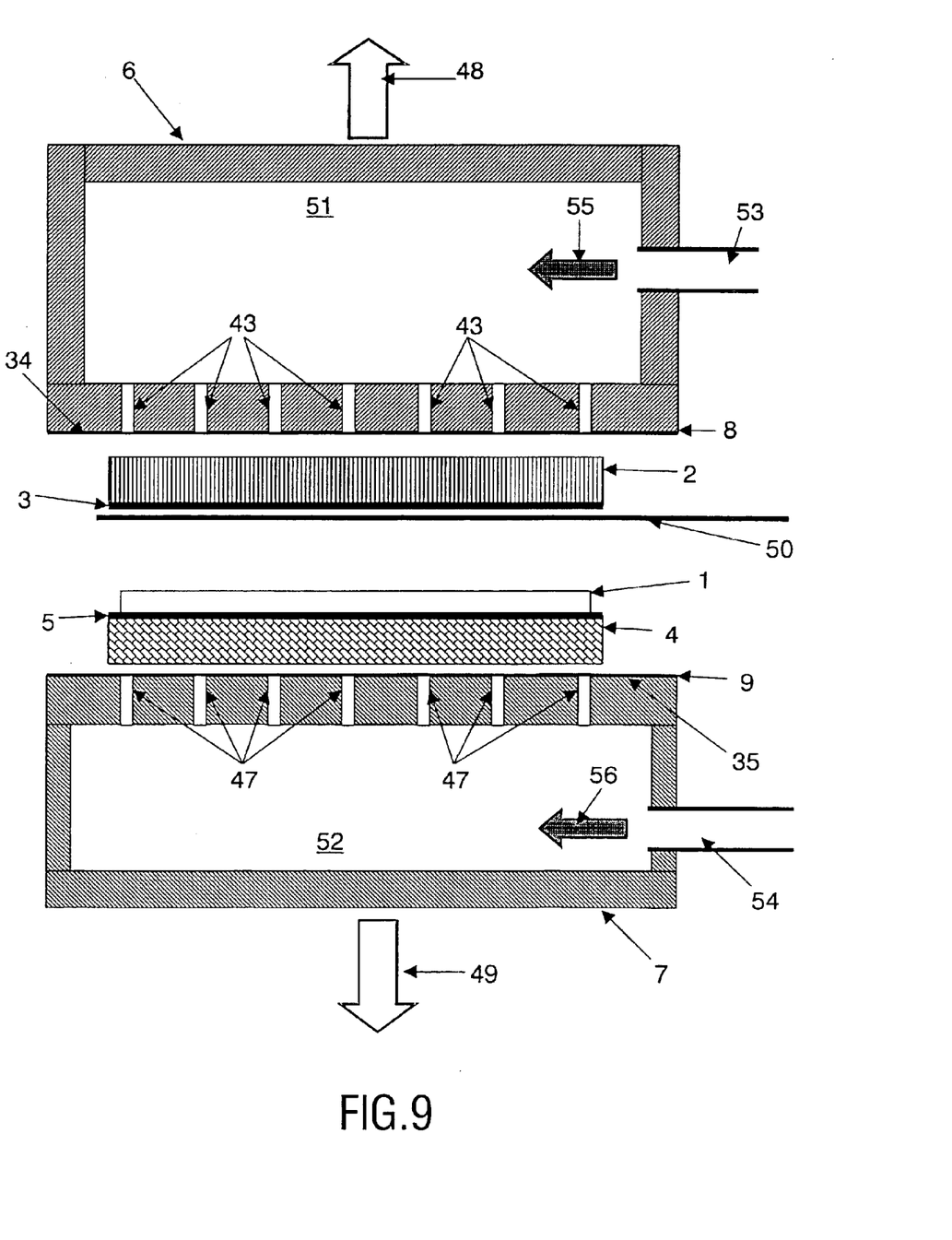
FIG. 9 shows the arrangement of FIGS. 7 and 8 after the additional separation of the first workpiece carrier from the first retaining device and of the second workpiece carrier complete with the workpiece joined thereto from the second retaining device.

FIG. 9 diagrammatically shows the separation of the workpiece carriers 2, 4 from the retaining devices 6, 7, which is carried out as the next process step in the embodiment of the arrangement of FIGS. 7 and 8. Elements described above have again been given the same reference numerals.

In the first process step illustrated in FIG. 9 for this embodiment, the first workpiece carrier 2 is separated from the first retaining device 6 through operation of the first pressure gas device 51. This is indicated with the dark hatching of the arrow 55. The pressure of the pressure gas acts on the first workpiece carrier 2 through the bores 43, thus detaching the third adhesive 8. If the latter is again formed as a double-sided adhesive foil in the manner described above, adhering to the surface 34, it is in particular the fifth adhesive layer 25 on the first surface 23 of this foil which is detached in this separation step. The foil thus remains on the first retaining device 6 and may be used for a subsequent connection of the first retaining device 6 to a (further) first workpiece carrier 2 (for a further workpiece 1). The third double-sided adhesive foil 8 has holes in the regions of the bores 43 with corresponding diameters so as to achieve a friction-free performance of this process step.

A surface 34 thus formed of the first retaining device 6 with the third double-sided adhesive foil 8 has a shape as diagrammatically shown in FIG. 10, which will be discussed in more detail below.

The arrangement of FIG. 9 also comprises a support 50 for receiving the first workpiece carrier 7 after its separation from the first retaining device 6. The first workpiece carrier 2 is laid on this support 50 for further use.

In this second embodiment, again, the second workpiece carrier 4 is separated from the second retaining device 7 in the same manner as the first workpiece carrier 2 from the first retaining device 6. This is shown in the lower part of FIG. 9. The second pressure gas device 52 is used for this purpose in an analogous manner; its operation is indicated by the dark hatching of the arrow 56. The fourth adhesive 9 is separated thereby; if the fourth adhesive 9 is constructed as a double-sided adhesive foil, its seventh adhesive layer 30 present on the first surface 28 of the fourth double-sided adhesive foil 9 is preferably separated again, so that the double-sided adhesive foil 9 remains on the surface 35 of the second retaining device 7 also in this case. A support (not shown) corresponding to the support 50 may be used for accommodating the second workpiece carrier 4 with the workpiece 1 separated from the second retaining device 7.

Figure 10:
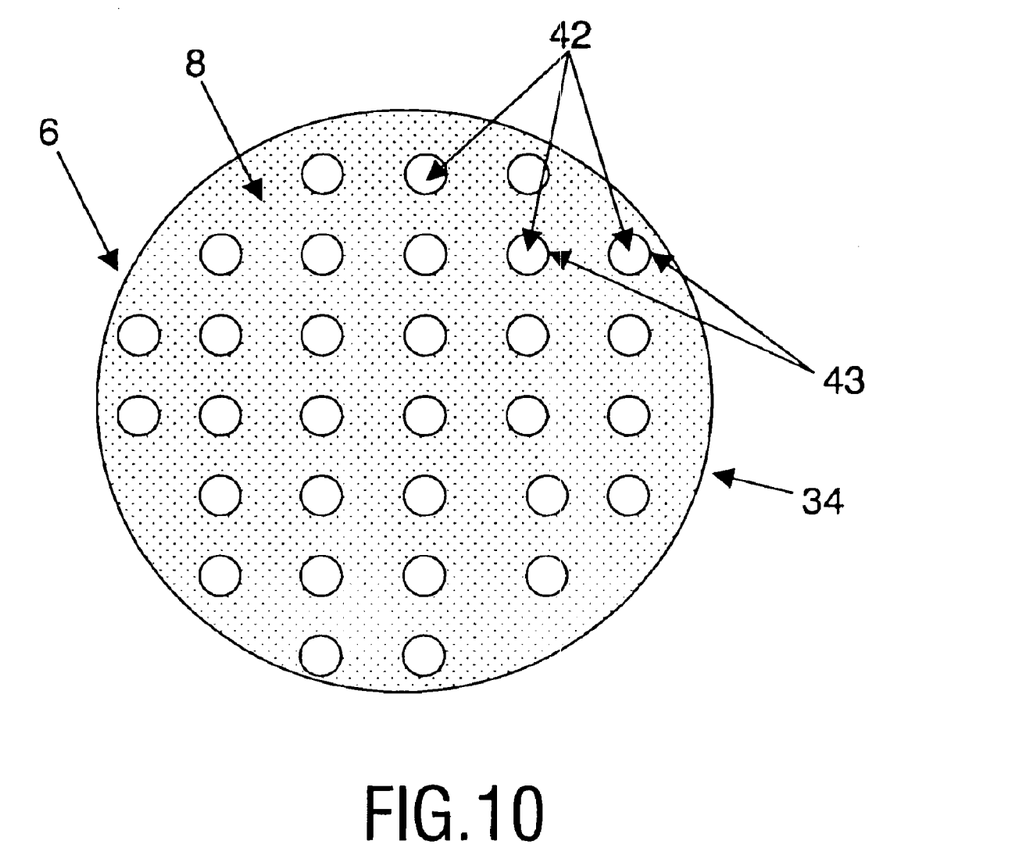
FIG. 10 is a diagrammatic plan view of the first or the second retaining device in the first or second embodiment.

FIG. 10 shows an embodiment of the surface 34 of the first retaining device 6 with the third double-sided adhesive foil 8 provided thereon, as well as the bores 43 for the ejector pins 42. The third double-sided adhesive foil 8 also has holes whose positions correspond to those of the bores 43. As a result, the ejector pins 42 can exert a pressure on the first workpiece carrier 2 without detaching the third double-sided adhesive foil 8 from the surface 34.

The second retaining device 7 with the surface 35 has a configuration corresponding to that of FIG. 10, with the fourth double-sided adhesive foil 9 taking the place of the third double-sided adhesive foil 8, the bores 47 taking the place of the bores 43, and the ejector pins 46 taking the place of the ejector pins 42.

A similar arrangement of the surfaces 34, 35 of the retaining devices 6, 7 is also found in the second embodiment, in which the pressure gas devices 51, 52 replace the plungers 41, 45 and the ejector pins 42, 46. In the arrangement of FIG. 10, the ejector pins 42, 46 are absent from the bores 43, 47; otherwise, the arrangement of the surfaces 34, 35 of the retaining devices 6, 7 is basically unchanged.

Figure 11:
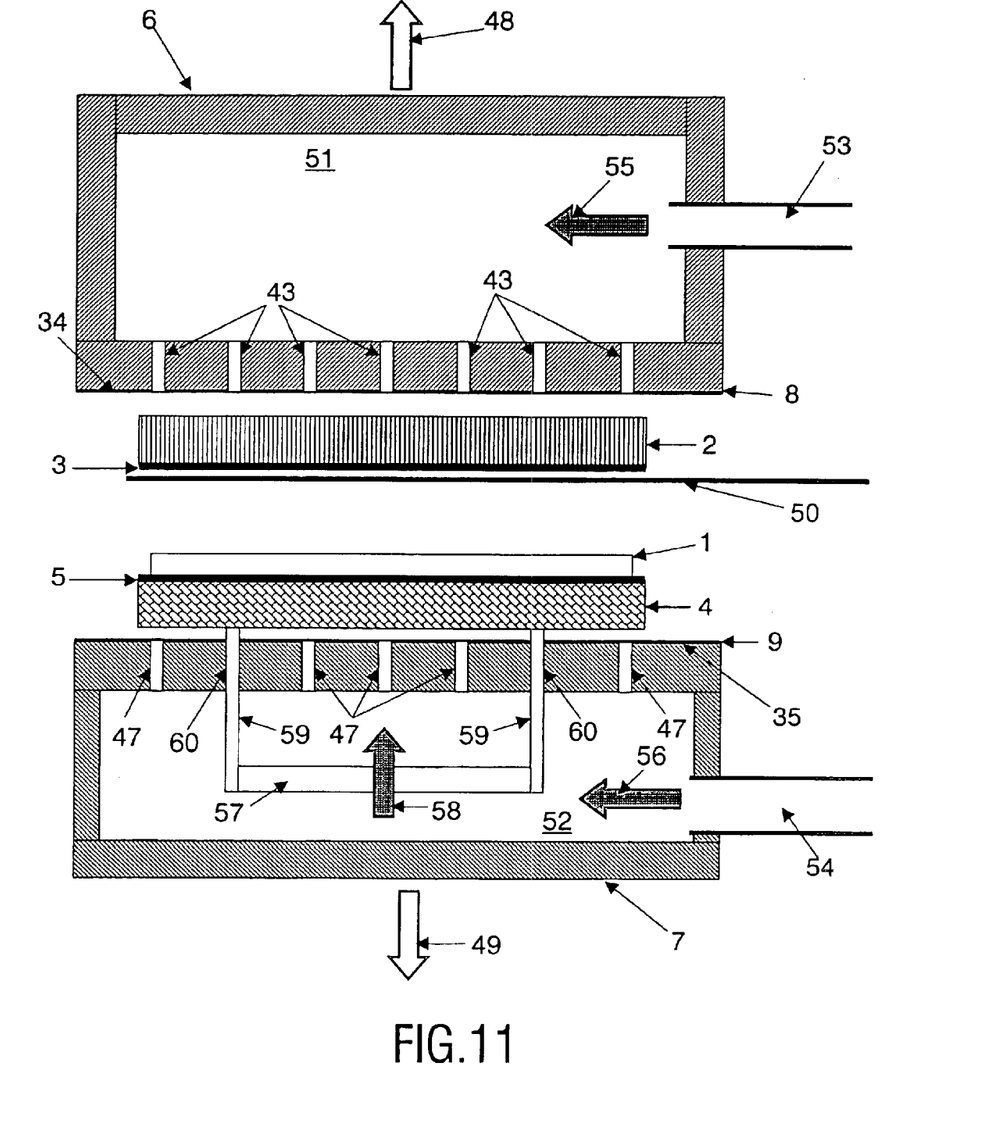
FIG. 11 shows a modification of the arrangement of FIG. 9 in a third embodiment, FIG. 12 diagrammatically shows an arrangement of one of the retaining devices in a construction with a magnet device and with support elements in the form of planar sheets on rollers in a fourth embodiment.

FIG. 11 shows a modification of the second embodiment of the invention shown in FIGS. 7, 8, and 9, with elements explained above being given the same reference numerals again. In addition to the elements and the process steps performed thereby of the second embodiment, the arrangement of the present, third embodiment shown in FIG. 11 comprises a second ejector 57 which comprises a number of ejector pins 59 which may preferably be smaller than the number of ejector pins 46, thus constituting the change with respect to the second ejection device 44 of the first embodiment shown in FIGS. 3, 5, and 6. The ejector pins 59 are passed through holes 60. These may be arranged in addition to the holes 47 for the pressure gas in the surface 35 of the second retaining device 7, or alternatively a number of the holes 47 may be used as holes 60 for the ejector pins 59. The construction of the second retaining device 7 again essentially corresponds to that of FIG. 10.

The sequence of the process steps in the third embodiment corresponds to that in the second embodiment. FIG. 11 shows this third embodiment in a state comparable to that shown in FIG. 9. In addition to the process steps described for the second embodiment, the ejector pins 59 of the second ejector 57 are moved out, shown by the dark hatched arrow 58 in FIG. 1, after the separation of the second workpiece carrier 4 from the second retaining device 7. As a result, the second workpiece carrier 4 already detached is lifted by the ejector pins 59, whereby in particular the spatial separation between the surface 35 and the second workpiece carrier 4 can be increased in a simple and defined manner, and the second workpiece carrier 4 may be removed from the second retaining device 7, for example in the manner mentioned above on a second support.

Figure 12:
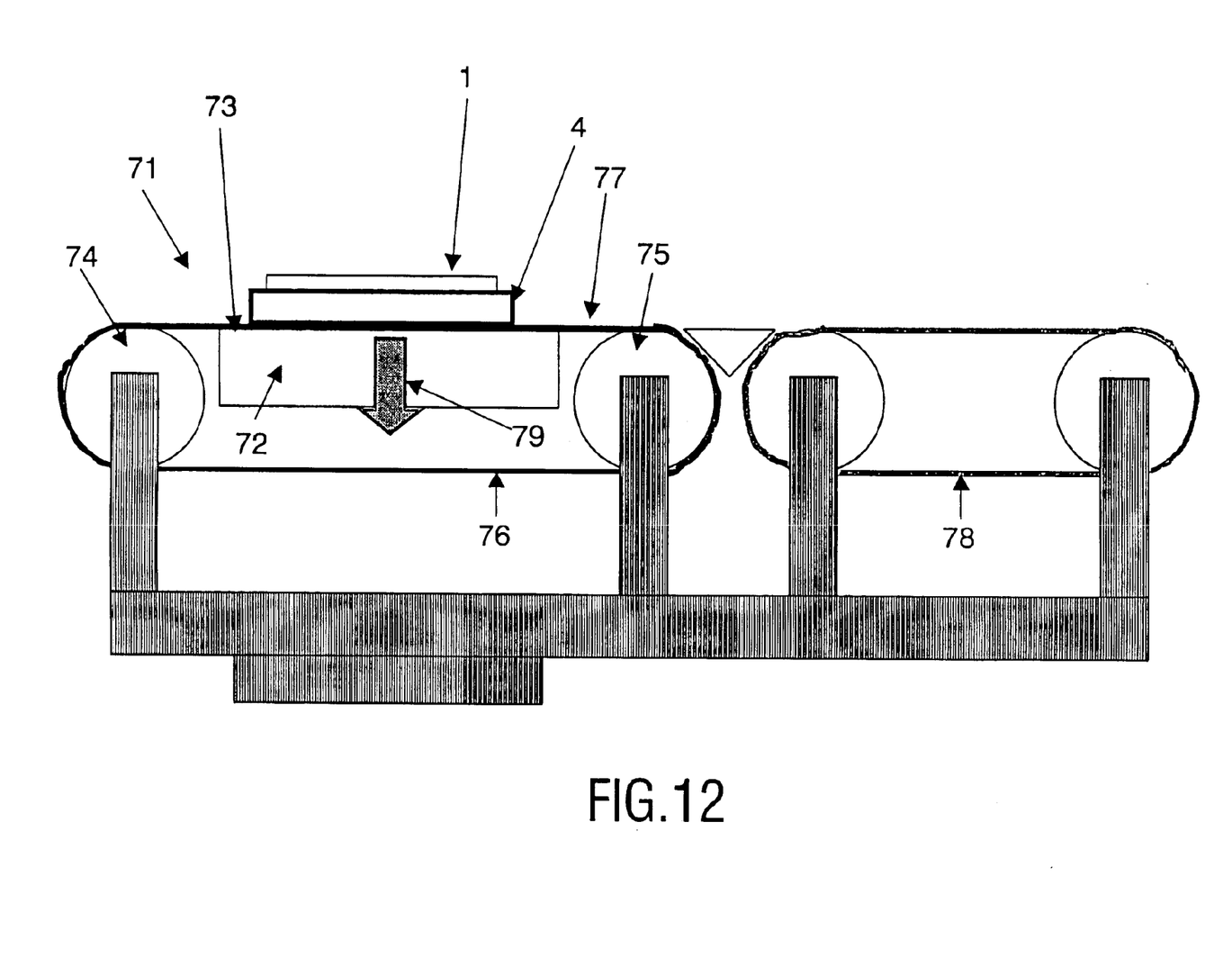

FIG. 12 diagrammatically shows a modification of a construction of a retaining device with respect to the example of the retaining device for the second workpiece carrier 4 in an arrangement with a magnet device and support elements in the form of planar sheets on rollers in a fourth embodiment. This modification of the retaining device is referenced 71. The retaining device 71 comprises an electromagnet on whose outer, at least substantially planar surface 73 a first moving track 76 rests, preferably constructed as a continuous track of steel, which is arranged around two rollers 74, 75 and can be rotated around the latter. The second workpiece carrier 4 with the workpiece 1 lies on this first moving track 76, which furthermore preferably is coated with an adhesive layer 77, for example a double-sided adhesive foil, on its surface facing away from the electromagnets. The second workpiece carrier 4 is here constructed from a ferromagnetic material so that it can be attracted by the electromagnets 72. In a modification of this embodiment, the retaining device 71 may alternatively be used as the first retaining device for the first workpiece carrier 2. In addition, there is the possibility of depositing the workpiece carriers 2, 4 directly on the surface 73 of the electromagnet 72, leaving out the first moving track 76.

The process steps in this fourth embodiment of the invention correspond substantially to those of the embodiments described further above. A variation, however, is found in the process step of separating the workpiece carrier—here the workpiece carrier 4—from the retaining devices—here the (second) retaining device 71. This is shown in FIGS. 12 to 14 and explained below.

As FIG. 12 shows, the electromagnet 72 is switched on for retaining the second workpiece carrier 4 on the retaining device 71 during the separation of the first adhesive 3. The magnetic attraction is symbolized by a dark hatched arrow 79. The adhesive layer 77 on the first moving track provides an additional fixation.

Figure 13:
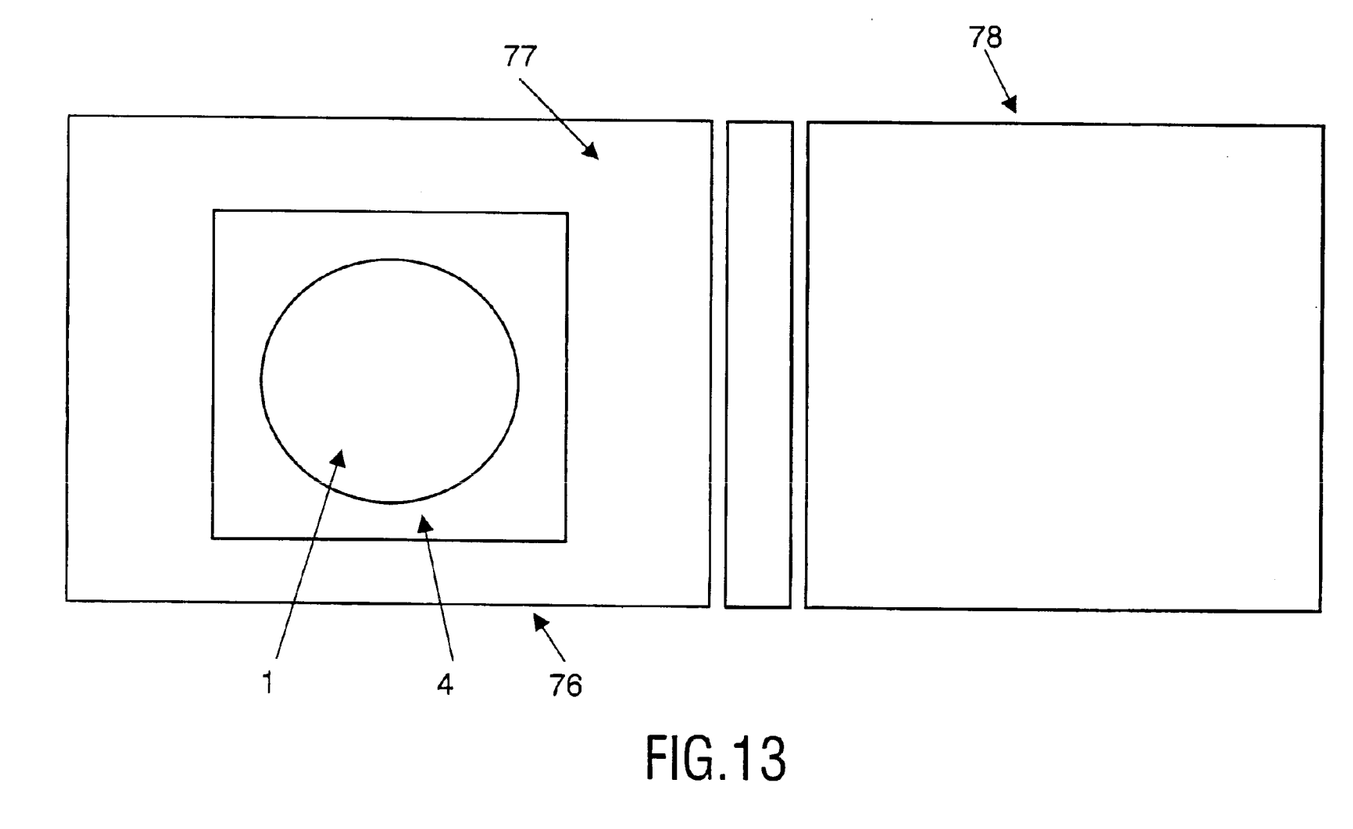
FIG. 13 is a diagrammatic plan view of the arrangement of FIG. 12, and FIG. 14 diagrammatically shows the arrangement of FIGS. 12 and 13 during rolling of one of the workpiece carriers.

FIG. 13 shows the arrangement with the retaining device 71, the first moving track 76, the second workpiece carrier 4, and the workpiece 1 in a diagrammatic plan view.

Figure 14:
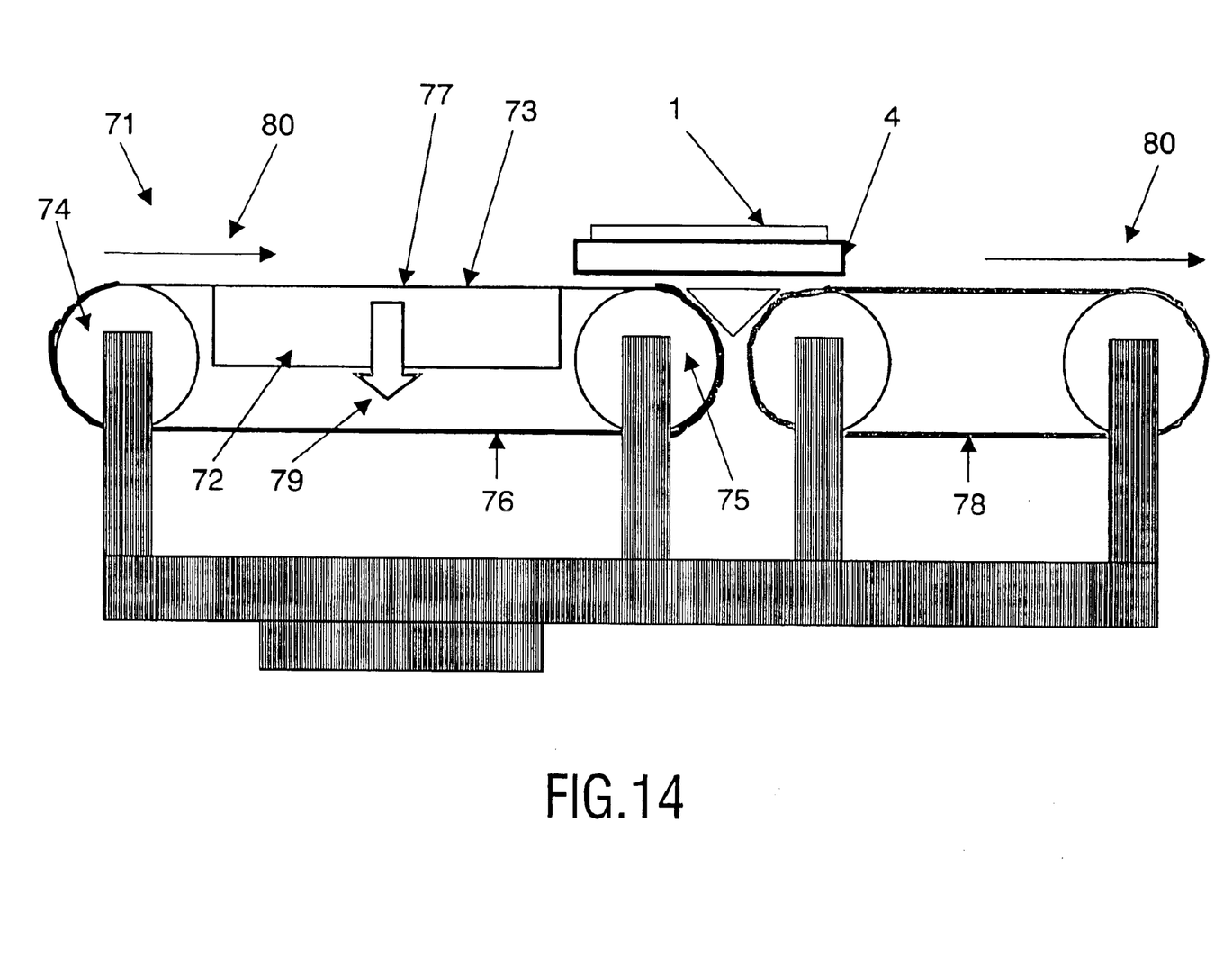

After the separation of the first adhesive 3, the electromagnet 72 is switched off, see FIG. 14, and the second workpiece carrier 4 is detached from the retaining device 71 thereby. The switching-off of the electromagnet 72 is symbolized by the absence of hatching in the arrow 79 in FIG. 14. The first moving track 76 is rotated for separating the second workpiece carrier 4 from the retaining device 71, whereby the second workpiece carrier 4 is removed from the effective range of the electromagnet 72. The second workpiece carrier 4 is moved from the first moving track 76 owing to the rolling movement thereof down onto a second moving track 78, whereby at the same time the adhesive layer 77 is automatically detached. The second moving track is preferably permeable to air and constructed without an adhesive layer and serves for further transport of the second workpiece carrier 4. The arrows 80 indicate the direction of movement of the moving tracks 76 and 78 during rolling.

In further modifications of the embodiments shown, the methods and devices for fastening the workpiece carriers to the retaining devices and for separating the workpiece carriers from the retaining devices may alternatively be combined such that different arrangements and methods are used for the first and the second retaining device. In addition to further possibilities, for example, a second retaining device in accordance with the fourth embodiment of FIGS. 12 to 14 may be combined with a first retaining device in accordance with the second embodiment shown in FIGS. 7 to 9.

What is claimed is:

1. A method of transferring a substantially disc-shaped workpiece from a first workpiece carrier, on which the workpiece is adhesively connected along a first of its main surfaces by means of a first adhesive in an at least substantially planar manner, onto a second workpiece carrier, which method comprises the following process steps:

fastening the second workpiece carrier with at least substantially planar adhesion to a second of the main surfaces of the workpiece opposed to the first main surface by means of a second adhesive whose adhesive force is substantially greater than the adhesive force of the first adhesive,     fastening the first workpiece carrier to a first retaining device,     fastening the second workpiece carrier to a second retaining device,     separating the workpiece from the first workpiece carrier along the first adhesive through the application of a pulling force between the first and the second retaining device, which force is at least partly perpendicular to the main surfaces of the workpiece, separating the first workpiece carrier from the first retaining device, and separating the second workpiece carrier complete with the workpiece connected thereto from the second retaining device.

2. A method as claimed in claim 1, characterized in that an at least substantially rigidly constructed workpiece carrier is used as the workpiece carrier.

3. A method as claimed in claim 1, characterized in that the fastening of the first workpiece carrier to the first retaining device is achieved by means of a third adhesive, such that the adhesive force of the third adhesive between the first workpiece carrier and the first retaining device is substantially greater than the adhesive force of the first adhesive.

4. A method as claimed in claim 3, characterized in that the separation of at least one of the retaining devices from the workpiece carrier fastened thereto is achieved by an ejection device forming part of at least one of said retaining devices.

5. A method as claimed in claim 4, characterized in that an ejection device comprising at least one ejector pin is used for separating the retaining device from the workpiece carrier fastened thereto, wherein the workpiece carrier fastened to said retaining device is detached from the retaining device by means of the ejector pin through a pressure exerted on that side of the workpiece carrier which faces the retaining device used for fastening the workpiece carrier to this retaining device.

6. A method as claimed in claim 4, characterized in that an ejection device comprising at least a pressure gas device is used for separating the retaining device from the workpiece carrier fastened thereto, wherein the workpiece carrier fastened to said retaining device is detached from the retaining device means of the pressure gas device through a pressure exerted on that side of the workpiece carrier which faces the retaining device used for fastening the workpiece carrier to this retaining device.

7. A method as claimed in claim 1, characterized in that the fastening of the second workpiece carrier of the second retaining device is achieved by means of a fourth adhesive, such that the adhesive force of the fourth adhesive between the second workpiece carrier and the second retaining device is substantially greater than the adhesive force to the first adhesive.

8. A method as claimed in claim 1, characterized in that the first workpiece carrier is constructed with a ferromagnetic material, and the fastening of the first workpiece carrier to the first retaining device is achieved by means of a first magnet device which can be energized or de-energized, as desired, and which generates a magnetic attraction between the first workpiece carrier and the first retaining device with a first magnetic force which is substantially greater than the adhesive force of the first adhesive.

9. A method as claimed in claim 8, characterized in that at least one of the retaining devices at which the fastening of the workpiece carrier is effected by a magnet device the workpiece carrier is arranged on a substantially planar support element which is movable with respect to the magnet device, which support element is moved away together with the workpiece carrier from the effective range of the magnet device for separating the workpiece carrier from the retaining device.

10. A method as claimed in claim 9, characterized in that at least one of the workpiece carriers is positioned on a first support element in the form of planar sheets, preferably made of steel and arranged on rollers, and the workpiece carrier is transferred onto a second support element in the form of planar sheets through rolling of the first support element in the form of a planar sheet for the purposes of separation from the retaining device.

11. A method as claimed in claim 1, characterized in that the second workpiece carrier is constructed with a ferromagnetic material, and the fastening of the second workpiece carrier to the second retaining device is achieved by means of a second magnet device which can be energized or de-energized, as required, and which generates a magnetic attraction between the second workpiece carrier and the second retaining device with a second magnetic force which is substantially greater than the adhesive force of the first adhesive.

12. A method as claimed in claim 1, characterized in that at least one of the adhesives is constructed as a double-sided adhesive foil.

\* \* \* \* \*